United States Patent
Ieki et al.

[11] Patent Number: 5,260,769
[45] Date of Patent: Nov. 9, 1993

[54] POSITION DETECTOR

[75] Inventors: Atsushi Ieki; Keiji Matsui; Masayuki Nashiki, all of Niwa, Japan

[73] Assignee: Okuma Corporation, Aichi, Japan

[21] Appl. No.: 839,405

[22] Filed: Feb. 20, 1992

[30] Foreign Application Priority Data

Feb. 25, 1991 [JP] Japan .................................. 3-53396

[51] Int. Cl.[5] .......................... G01B 11/14; G01D 5/34
[52] U.S. Cl. ............................... 356/374; 250/237 G;
250/231.14; 250/231.16; 33/707
[58] Field of Search ................ 356/373, 374, 375, 356,
356/358, 363; 250/237 G, 231.14, 231.16,
231.18; 33/706, 707

[56] References Cited

U.S. PATENT DOCUMENTS

| | | | |
|---|---|---|---|
| 4,733,071 | 3/1988 | Tokunaga | 250/237 G |
| 4,840,488 | 6/1989 | Kabaya et al. | 356/374 |
| 4,928,009 | 5/1990 | Ikebe et al. | 250/237 G |
| 4,985,623 | 1/1991 | Ichikawa et al. | 250/237 G |

Primary Examiner—Richard A. Rosenberger
Assistant Examiner—Hoa Q. Pham
Attorney, Agent, or Firm—Wenderoth, Lind & Ponack

[57] ABSTRACT

The amount of relative in-surface rotation between two scales of a position detector is precisely detected to thereby determine the deviation in longitudinal phase between tracks in one scale. Thus, positional data corresponding to signals from the tracks are made appropriate. The resultant positional data are used so that stable detection of an absolute position is performed. The position detector includes: a first scale provided with a plurality of graduation tracks having different pitches, the first scale being movable in the longitudinal direction thereof; a reading unit having a plurality of detecting sections opposing the graduation tracks, the detecting sections obtaining, from the graduation tracks, signals indicative of a relative movement between the first scale and the reading unit; a conversion circuit for converting the signals obtained by the detecting sections into items of data on positions; and a data processing circuit for combining together said items of said data on said positions so as to obtain data on the absolute position of the first scale, the position detector further including an in-surface rotation amount detecting section for detecting the amount of rotational displacement of the reading unit with respect to the first scale about an axis of rotation constituted by a segment perpendicular to the surface of the first scale, said data processing circuit being adapted to use said rotational displacement amount to appropriately combine together items of data on positions obtained by the conversion circuit so as to obtain data on the absolute position of the first scale.

5 Claims, 7 Drawing Sheets

POSITION DETECTOR

BACKGROUND OF THE INVENTION

1. Field of the Invention

The present invention relates to a position detector which may be used to perform position measurement in a machine tool or the like and, more particularly, to such a position detector of the absolute type.

2. Description of the Related Art

An absolute-type position detector generally employs a Gray code as the code pattern. The use of the Gray code entails some problems when the absolute range is widened. The widening results in a corresponding increase in the number of tracks. Accordingly, a problem arises in that the sectional area of the position detector is increased. Another problem is that the number of the tracks requires light-receiving a corresponding number of systems electric circuits, etc. In view of these problems, a position detector capable of obtaining an absolute position with a small number of the tracks, has been proposed.

FIG. 1 is a block diagram showing an example of a conventional position detector capable of obtaining an absolute position with a small number of tracks. Light emitted from a light source section including a light-emitting element 101 and a collimator lens 102 passes to a first scale 103. The first scale 103 has a plurality of grating tracks, in which light-transmitting portions and non-light-transmitting portions are repeated at certain pitches. The first scale 103 is movable in the longitudinal direction thereof or in a direction perpendicular to the surface of the drawing.

FIG. 2 shows an example of the construction of the grating tracks provided in the first scale 103. The relationship between the pitches of the grating tracks is expressed by the ratio 1:N (N being an integer greater than three). More specifically, the pitches P1, P2 and P3 of grating tracks t1, t2 and t3 (in three rows) have a mutual relationship expressed as: P1:P2:P3 = 1:10:100. Light transmitted through the light-transmitting portions of the first scale 103 enters a second scale 104, within a reading unit 106, which is formed with grating tracks t1, t2 and t3 similar to those of the first scale 103. Light transmitted through the light-transmitting portions of the second scale 104 enters photodetectors 1051, 1052 and 1053, also within the reading unit 106, which respectively correspond to the grating tracks t1, t2 and t3 of the second scale 104. The photodetectors 1051, 1052 and 1053 convert the received light into electrical signals SS1, SS2 and SS3, respectively, and send the signals to signal interpolation circuits 1111, 1112 and 1113, respectively, which form a part of a signal processing circuit 110.

Each of the signal interpolation circuits 1111, 1112 and 1113 subjects the sent electrical signal SS1, SS2 or SS3 to interpolation-dividing with a value which is within the pitch of the grating track t1, t2 or t3 of the first scale 103 and which is above the ratio N of the pitch of the grating track t1, t2 or t3. Thus, the signal interpolation circuits 1111, 1112 and 1113 respectively obtain items of data SP1, SP2 and SP3 on the absolute position and within one grating pitch, which data are sent to a data processing logic circuit 112 forming another part of the signal processing circuit 110. The data processing logic circuit 112 combines the absolute position data SP1, SP2 and SP3 within one grating pitch with each other, and outputs the result of the combination as absolute position data SP on the amount of movement of the first scale 103. In order to assure that the items of the absolute position data within one grating pitch are combined without any error, the data processing logic circuit 112 has a certain determination function for the determining, with respect to the absolute position data in the vicinity of a boundary between one-grating-pitch divisions, whether or not a carry to the higher-order or lower-order division should be effected. The range within which the position detector 100 detects an absolute position corresponds to the value of the maximum of the pitches of a plurality of the grating tracks.

The above-described position detector 100 outputs correct absolute position data when the first scale 103 and the reading unit 106 move relative to each other while they remain in their desired position. However, when a variation in the position has occurred, in which the first scale 103 and the reading unit 106 have rotated relative to each other about a normal perpendicular to the scale surface, the items of the absolute position data from the grating tracks having different pitches may not be properly combined together. This may result in erroneous absolute position data being outputted. When, as shown in FIG. 2, the reading unit 106 has slightly rotated relative to the first scale 103 in the direction indicated by the arrows to be positioned as indicated by the broken lines, the phases of the grating tracks t1 and t2 in the longitudinal direction thereof deviate by one half of the pitch P1 (P1/2), thereby making it impossible to properly combine positional data. As a result, the absolute position data obtained by the data processing logic circuit 112 in this case has, as compared with data obtainable in the case where a relative movement has occurred between the first scale 103 and the second scale 104 while they are in their desired position, an omission corresponding to the pitch P1 of the grating track t1. Thus, the occurrence of a variation in the position of the reading unit 106 relative to the first scale 103 entails the problem of reducing the reliability of a combination of the absolute position data. Conversely, in order to ensure the reliability, it is necessary that the straightness of the machine, etc. on which the position detector is mounted, be controlled, and this is another problem.

SUMMARY OF THE INVENTION

The present invention has been accomplished in view of the above-described circumstances. An object of the present invention is to provide a position detector capable of detecting an absolute position without involving reading errors even in the event of a variation in the straightness of or the position in the machine, etc. on which the position detector is mounted. The present invention provides a position detector having: a first scale provided with a plurality of graduation tracks having different pitches, the first scale being movable in the longitudinal direction thereof; a reading unit having a plurality of detecting sections opposing to the graduation tracks, the detecting sections obtaining, from the graduation tracks, signals indicative of a relative movement between the first scale and the reading unit; a conversion circuit for converting the signals obtained by the detecting sections into items of data on positions; and a data processing circuit for combining together the items of the data on the positions so as to obtain data on the absolute position of the first scale. In order to achieve the above object, the position detector according to the present invention further comprises an in-surface rotation amount detecting section for detecting the amount of a rotational displacement of the reading unit with respect to the first scale about an axis of rotation constituted by a segment perpendicular to the surface of the first scale, the data processing circuit being adapted to use the rotational displacement amount to appropriately combine together items of data on positions obtained by the conversion circuit so as to obtain data on the absolute position of the first scale.

According to the present invention, the amount of relative insurface rotation between two scales is precisely detected to thereby determine the deviation in longitudinal phase between tracks in one scale. Thus, positional data corresponding to signals from the tracks are made appropriate. The resultant positional data are used so that stable detection of an absolute position is performed.

The nature, principle and utility of the invention will become more apparent from the following detailed description when read in conjunction with the accompanying drawings.

DESCRIPTION OF THE PREFERRED EMBODIMENTS

Figure 1:
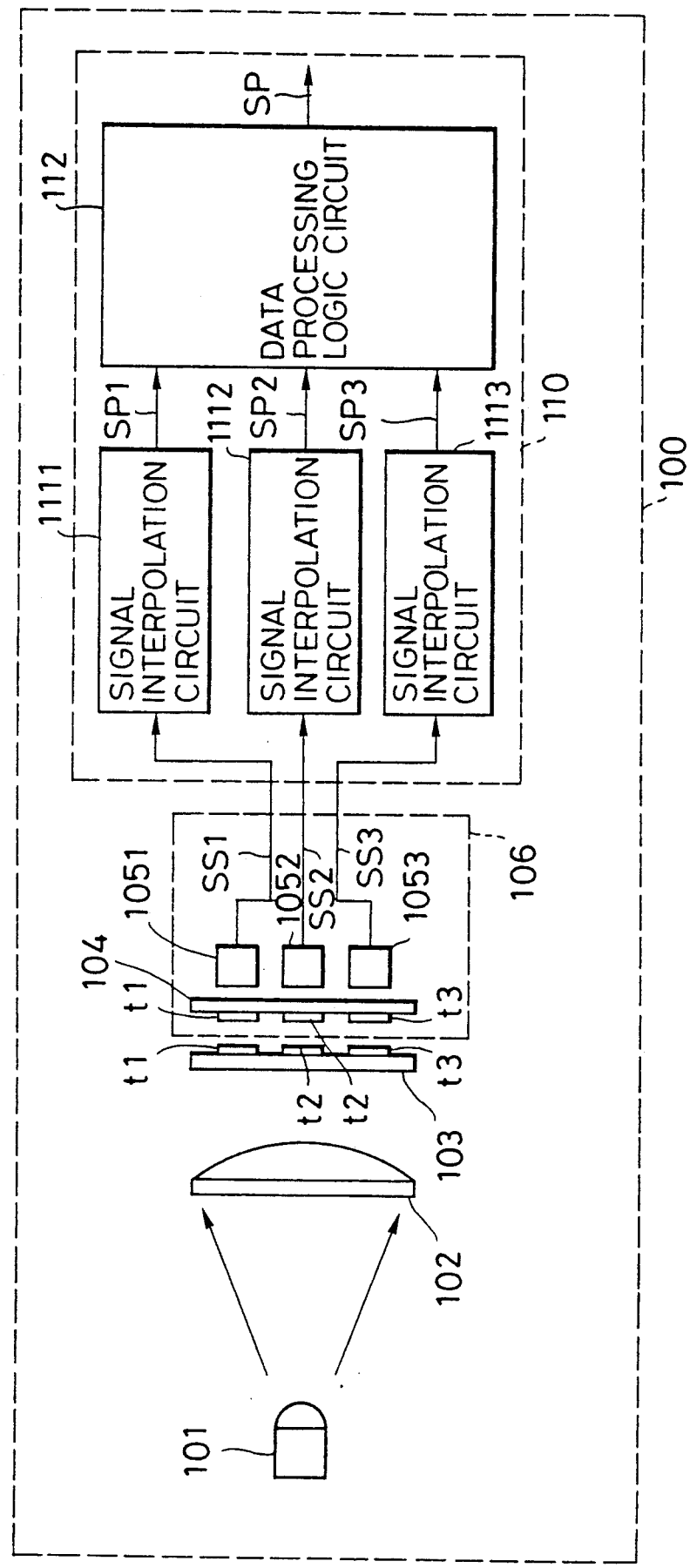
FIG. 1 is a block diagram showing an example of a position detector of the related art.
Figure 2:
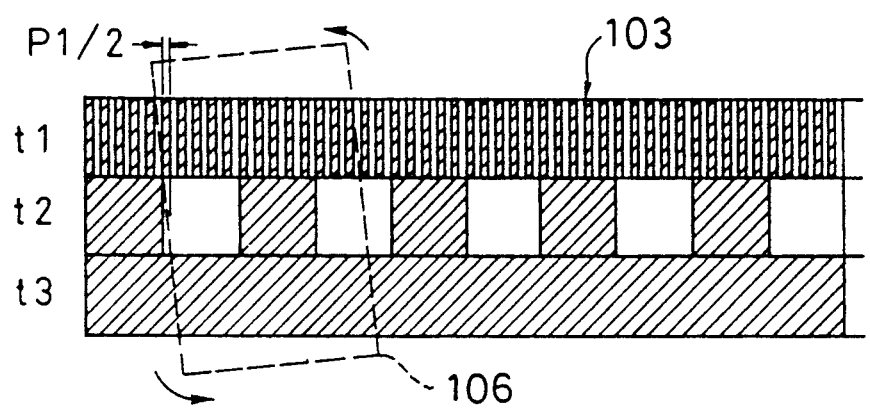
FIG. 2 is a diagram showing an example of a first scale of the position detector shown in FIG. 1.
Figure 3:
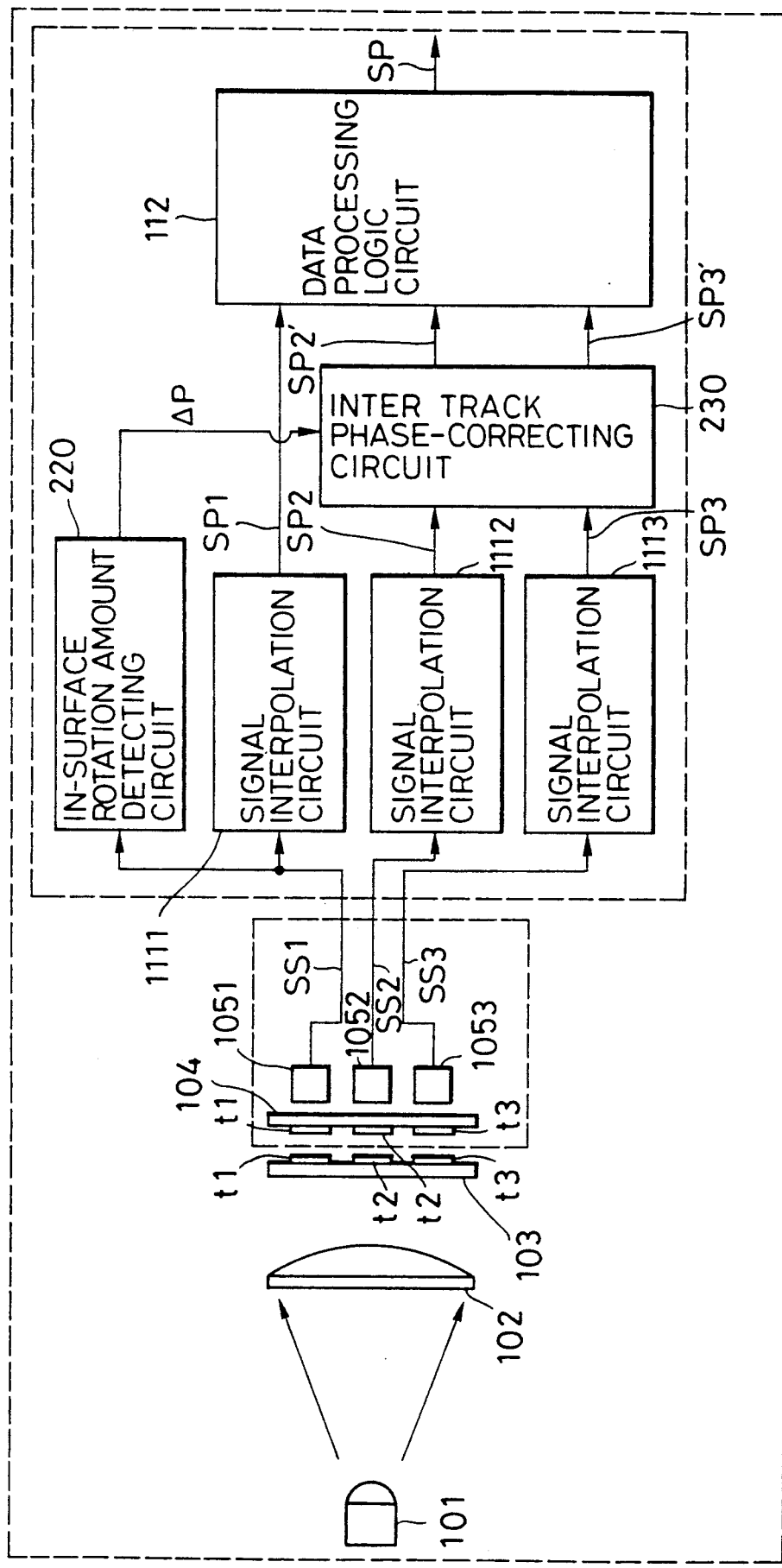
FIG. 3 is a block diagram showing an example of a position detector according to the present invention.

FIG. 3 is a block diagram showing an example of a position detector according to the present invention, the block diagram corresponding to that shown in FIG. 1; those components of the position detector corresponding to the components shown in FIG. 1 are denoted by identical reference numerals, and their description has been omitted.

Figure 4:
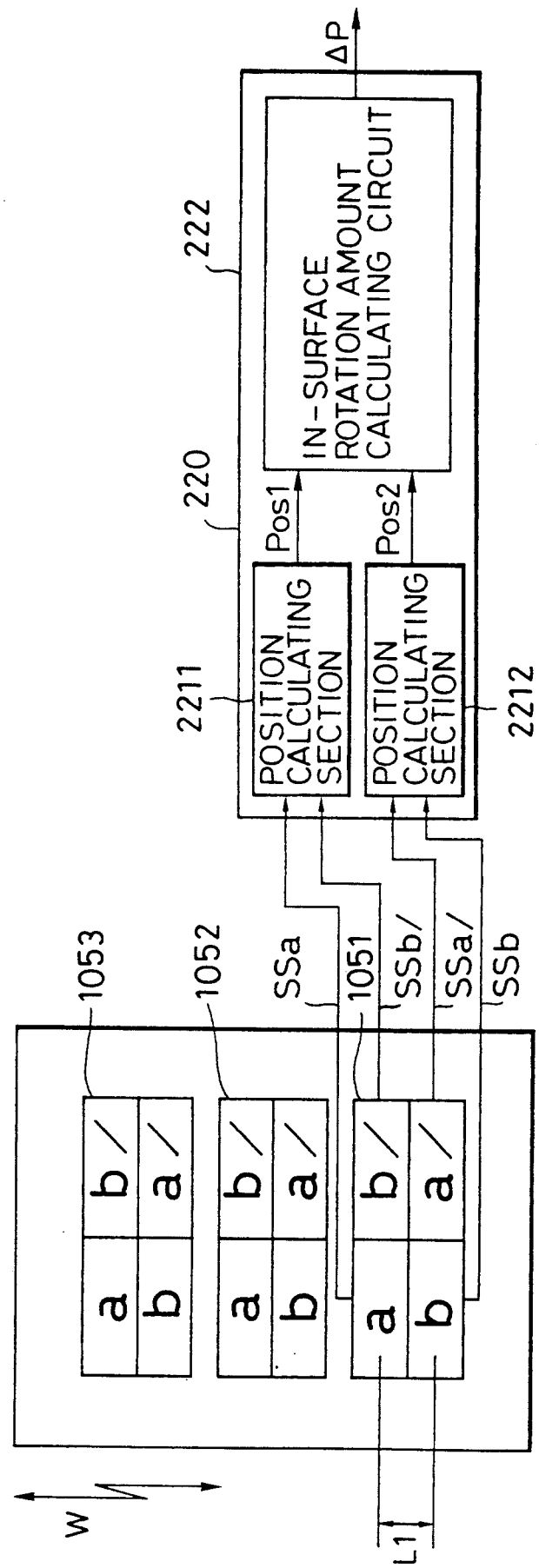
FIG. 4 is a block diagram showing a first example of the construction of photodetectors and an in-surface rotation amount detecting circuit of the position detector according to the present invention.

As shown in FIG. 3, a position detector 200 includes a signal processing circuit 210, in which an in-surface rotation amount detecting circuit 220 and an inter-track phase-correcting circuit 230 are newly provided. FIG. 4 is a diagram showing an example of the construction of photodetectors 1051, 1052 and 1053 and the in-surface rotation amount detecting circuit 220. A second scale 104 has a plurality of grating tracks t1, t2 and t3, and each of the grating tracks has grating portions a, b, a/ and b/ arranged therein, the grating portions differing from each other in phase by a quarter of a signal period obtainable therefrom. In correspondence with these grating portions, four-channel photodetecting element portions a, b, a/ and b/ are arranged in each of the photodetectors 1051, 1052 and 1053. Four-phase electrical signals SSa, SSb, SSa/ and SSb/ obtained by the photodetector 1051 are sent to the in-surface rotation amount detecting circuit 220. The in-surface rotation amount detecting circuit 220 has two position calculating sections 2211 and 2212, and an insurface rotation amount calculating circuit 222. Among the signals from the photodetector 1051, the electrical signals SSa and SSb/ are sent to the position calculating section 2211, whereas the electrical signals SSb and SSa/ are sent to the position calculating section 2212. Each of the position calculating sections 2211 and 2212 calculates absolute position data Pos1 and Pos2 within the corresponding grating pitch, which data are sent to the in-surface rotation amount calculating circuit 222. The positional data Pos1 calculated by the position calculating section 2211 and the positional data Pos2 calculated by the position calculating section 2212 differ from each other in the point of detection by a distance L1 in the width direction W of the second scale 104. Accordingly, when a variation in a direction of in-surface rotation has occurred, an offset $\Delta P$ of the longitudinal position occurs between the two items of the positional data Pos1 and Pos2. Therefore, the in-surface rotation amount calculating circuit 222 calculates the magnitude of the offset $\Delta P$ by obtaining the difference between the two items of the positional data Pos1 and Pos2. The offset $\Delta P$ may alternatively be a value equivalent to an angular difference. In order to assure that the positional data Pos1 and Pos2 are precisely calculated, the voltage offset, the amplitude voltage, etc. of electrical signals obtainable by the photodetector 1051 may be standardized, and variations in the voltages, etc. may be fed back.

Figure 5:
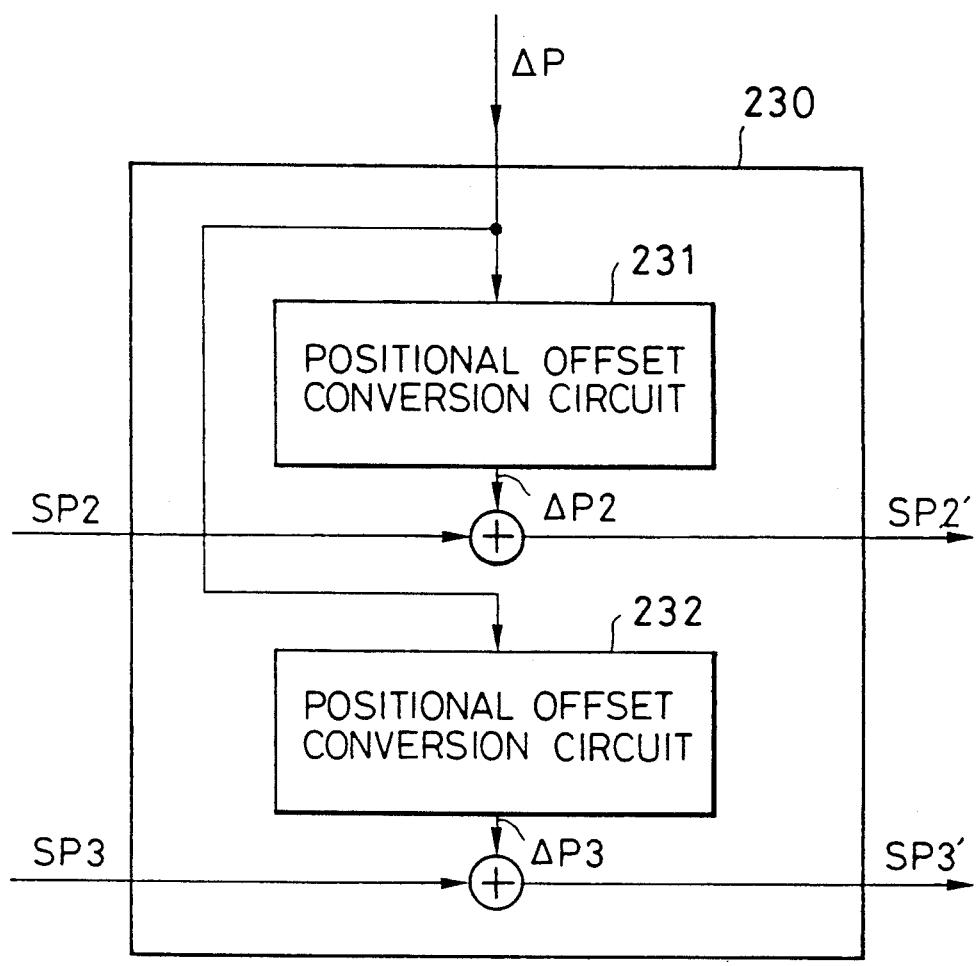
FIG. 5 is a block diagram showing an example of an inter-track phase-correcting circuit of the position detector according to the present invention.
Figure 6:
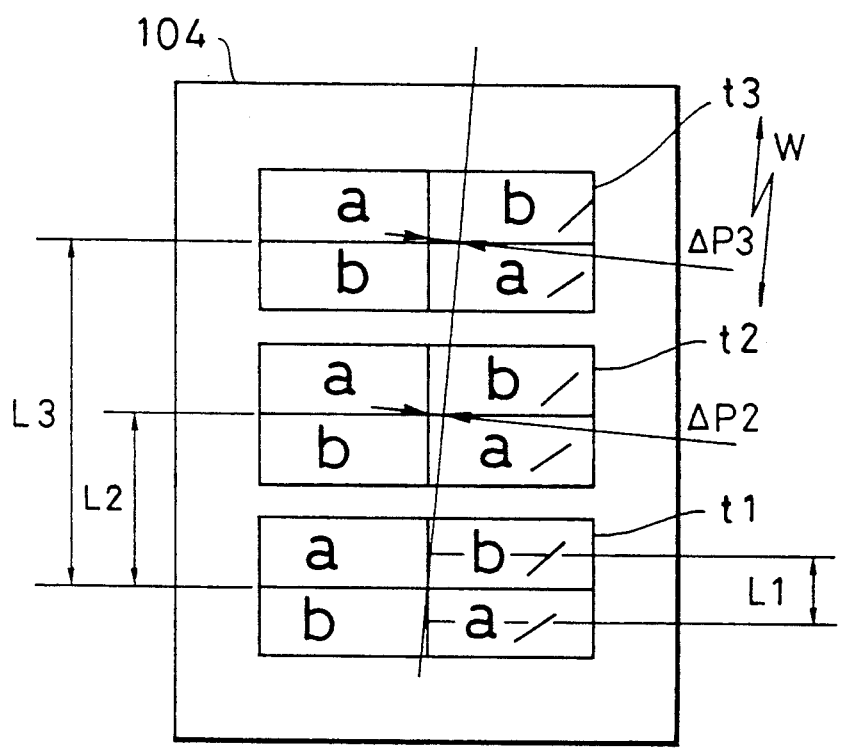
FIG. 6 is a diagram showing an example of a second scale of the position detector according to the present invention.

FIG. 5 is a diagram showing an example of the construction of the inter-track phase-correcting circuit 230. The inter-track phase-correcting circuit 230 includes positional offset conversion circuits 231 and 232, which respectively convert, on the basis of the respective distances L2 and L3 (shown in FIG. 6) in the width direction W of the second scale 104 as between the bary centers of the grating tracks t1 and t2 of the second scale 104 and between the bary centers of the grating tracks t1 and t3 of the second scale 104, the offset $\Delta P$ from the in-surface rotation amount calculating circuit 222 into offset values $\Delta P2$ ($=\Delta P \times L2/L1$) and $\Delta P3$ ($=\Delta P \times L3/L1$) pertinent to the grating tracks t2 and t3, respectively. These values $\Delta P2$ and $\Delta P3$ are respectively added to absolute position data SP2 and absolute position data SP3 from the signal interpolation circuits 1112 and 1113, respectively, so as to correct the absolute position data SP2 and SP3. The results of the correction are sent, as absolute position data SP2' and SP3' within the corresponding grating pitches, to the data processing logic circuit 112. Therefore, even when a variation has occurred in position due to the in-surface rotation or the like, the data processing logic circuit 112 is capable of stably outputting absolute position data SP (now in the form of a single item of data) on the amount of movement of the first scale 103. Although in the construction illustrated in FIG. 6, each of the grating tracks of the second scale 104 has grating portions arranged in two rows and two columns in a rectangular shape, the present invention is not intended to be limited thereto, and the grating portions may alternatively be such that they are all arranged in a single column.

Figure 7:
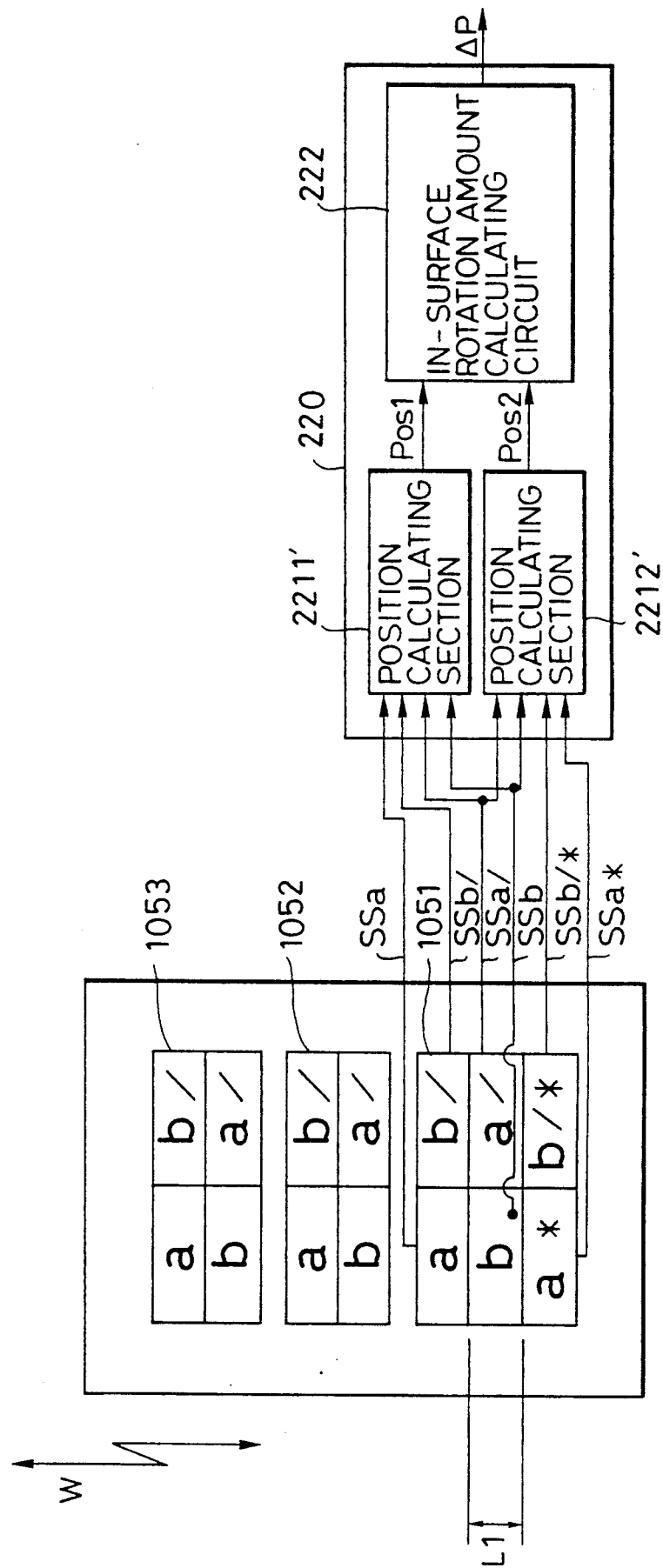
FIG. 7 is a block diagram showing a second example of the construction of photodetectors and an in-surface rotation amount detecting circuit of the position detector according to the present invention.

FIG. 7 shows another example of the construction of the photodetectors 1051, 1052 and 1053 as well as the in-surface rotation amount detecting circuit 220 of the position detector 200 according to the present invention. The position detector 200 is distinguished by the addition of grating portions to the grating track t1 of the second scale 104 and the addition of element portions to the photodetector 1051, and is thus adapted to detect a variation caused by in-surface rotation with a higher level of precision. More specifically, a grating pattern consisting of grating portions a* and b/* is added below the first row (consisting of the grating portions a and b/) and the second row (consisting of the grating portions b and a/) and, similarly, the photodetecting element portions are added. The additional portions a* and b/* are so patterned as to be in phase with the portions a and b/ forming the first row, with the portions b and a/ forming the second row being interposed between the first row and the additional row.

With the above-described construction, an in-surface rotation amount is detected by the following processes.

The photodetector 1051 obtains electrical signals SSa, SSa/, SSb, SSb/, SSa* and SSb/* by converting signals from the grating track t1. These electrical signals are sent to the signal interpolation circuit 1111 and also to the in-surface rotation amount detecting circuit 220. The signal interpolation circuit 1111 converts, through interpolation calculations, the electrical signals SSa, SSa/, SSb, SSb/, SSa* and SSb/* into absolute position data SP1 within the grating pitch P1. The within-one-pitch (p1) absolute position data SP1 may be obtained from either the electrical signals SSb, SSa/, SSa* and SSb* or the electrical signals SSa, SSb, SSa/ and SSb/. It is also possible to obtain an average of these electrical signals or to combine them together while weighting some of the electrical signals. Such averaging or combining enables a smoothing of noise components and so on. The in-surface rotation amount detecting circuit 220 has a position calculating section 2211' to which the electrical signals SSa, SSb, SSa/ and SSb/ from the photodetector 1051 are sent, and another position calculating section 2212' to which the electrical signals SSb, SSa/, SSa* and SSb/* are sent. The position calculating sections 2211' and 2212' respectively calculate the absolute position data Pos1 and Pos2 within the corresponding grating pitches, which the absolute position data Pos1 and Pos2 are sent to the in-surface rotation amount calculating circuit 222. The absolute positional data Pos1 and Pos2 thus calculated have a higher level of precision than those calculated with the construction shown in FIG. 4. This is for the following reasons:

When the absolute positional data, for example, Pos1, is calculated from four-phase electrical signals, the positional data is calculated from two differential signals, that is, a differential signal (=A) between the electrical signals SSa and SSa/ and a differential signal (=B) between the electrical signals SSb and SSb/. The calculation using the differential signals A and B serves to offset variations in the voltage offset of the electrical signals SSa, SSb, SSa/ and SSb/, and also to offset even-number-multiple higher harmonic components contained in the electrical signals.

Further, even when a variation in a direction of the in-surface rotation has occurred, no change occurs in the phase difference between the differential signals A and B, thereby enabling more stable calculation of the absolute position data Pos1 and Pos2 within the corresponding grating pitches. Subsequently, similarly to the foregoing embodiment, the insurface rotation amount calculating circuit 222 calculates an offset $\Delta P$ of the longitudinal position, caused between the two items of the positional data Pos1 and Pos2 by a variation in a direction of the in-surface rotation, by calculating the difference between the positional data Pos1 and Pos2.

Then, in the inter-track phase-correcting circuit 230 (shown in FIG. 5), the positional offset conversion circuits 231 and 232 convert the offset $\Delta P$ from the in-surface rotation amount calculating circuit 222 so that, on the basis of the respective distances L2 and L3 (such as those shown in FIG. 6) in the width direction W of the second scale 104 as between the bary centers of the grating tracks t1 and t2 of the second scale 104 and between the bary centers of the grating tracks t1 and t3 of the second scale 104, the offset $\Delta P$ is converted into values $\Delta P2$ (=$\Delta P \times L2/L1$) and $\Delta P3$ (=$\Delta P \times L3/L1$) pertinent to the grating tracks t2 and t3, respectively. These values $\Delta P2$ and $\Delta P3$ are respectively added to the absolute position data SP2 and SP3 from the signal interpolation circuits 1112 and 1113, respectively, so as to correct the position data SP1 and SP3. The results of the correction are sent, as absolute position data SP2' and SP3', to the data processing logic circuit 112. Therefore, even when a variation has occurred in position due to the in-surface rotation or the like, the data processing logic circuit 112 is capable of stably outputting absolute position data SP (now a single item of data) on the amount of movement of the first scale 103. Although in the construction illustrated in FIG. 7, the additional portions a* and b/* are so patterned as to be in phase with the first-row portions a and b/ with the second-row portions b and a/ interposed between the first and additional rows, the additional-row portions may alternatively have a predetermined phase difference from the first-row portions.

Although in the position detector according to each of the foregoing embodiments, the ratio of mutually different pitches of a plurality of grating tracks is expressed by 1: N (N being an integer greater than three), the present invention is not intended to be limited thereto, and the present invention is applicable to cases where a Gray code, a vernier pattern, or the like is used. Further, an actuator for moving the second scale in either direction of in-surface rotation may be provided in the structure supporting the second scale, and be controlled in such a manner as to prevent a variation from being caused by the in-surface rotation. Further, although a linear-type optical encoder has been illustrated, the present invention is also applicable to a position detector of a rotary-type, a magnetic type, an electromagnetic type, or an electrostatic capacity type.

As has been described above, since the straightness of a machine and so on on which the position detector is mounted need not be strictly controlled, it is possible to reduce the labor, costs or the like required for maintenance. Furthermore, since the interpolation of detection values from the grating tracks are not required to be strictly precise, it is possible to reduce production costs.

It should be understood that many modifications and adaptations of the invention will become apparent to those skilled in the art and it is intended that such obvious modifications and changes be encompassed in the scope of the claims appended hereto.

What is claimed is:

1. A position detector comprising:
   a first linear scale provided with a plurality of graduation tracks having different pitches, said first linear scale being movable in a longitudinal direction thereof;

a reading unit having a plurality of detecting sections opposing said plurality of graduation tracks, said plurality of detecting sections generating signals indicative of a relative movement between said first linear scale and said reading unit;

a position conversion circuit for respectively converting said signals generated by said plurality of detecting sections into data on linear positions;

an absolute position processing circuit for combining said data on said linear positions from said position conversion circuit so as to generate data as to an absolute linear position of said first linear scale;

a first linear position detecting section for detecting a linear position on a first point in a smallest pitch track;

a second linear position detecting section for detecting a linear position on a second point separated from said first point by a predetermined distance in a width direction W of said reading unit;

a position error detecting section for detecting an amount of error in a position of said reading unit with respect to a rotational direction on a rotation axis which is a line perpendicular to a surface of said first linear scale from a detected linear position due to said first and second points;

a position offset conversion circuit for converting the amount of position error into a position offset for a high-pitch; and a track phase correcting circuit for correcting linear position data of the high-pitch track by using the position offset;

wherein said absolute position processing circuit generates absolute position data of said first linear scale by combining a linear position data of the smallest pitch track with a linear position data of the high-pitch track which has been corrected by said track phase correcting circuit.

2. A position detector according to claim 1, wherein said first linear position detecting section and said second linear position detecting section comprise at least four detecting elements having different phases with respect to each other.

3. A position detector according to claim 1, wherein said first linear position detecting section and said second linear position detecting section comprise at least six detecting elements having different phases with respect to each other, said first linear position detecting section generating a linear position due to four detecting elements which are shifted in the width direction W of said reading unit and said second linear position detecting section generating a linear position due to four detecting elements which are shifted in a direction which is opposite to the width direction W.

4. A position detector according to claim 3, wherein said four detecting elements which are shifted in the width direction W respectively are disposed in two rows and two columns in a rectangular shape, and two detecting elements having the same phase with respect to two upper detecting elements of said rectangular shape are disposed under the detecting elements in said rectangular shape.

5. A position detector according to claim 1, wherein each of said detecting sections comprises an optical grating and a photodetector.

* * * * *